United States Patent
Wang (10) Patent No.: US 7,550,320 B2
(45) Date of Patent: Jun. 23, 2009

(54) METHOD OF FABRICATING SUBSTRATE WITH EMBEDDED COMPONENT THEREIN

(75) Inventor: Chien-Hao Wang, Hsinchu (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 405 days.

(21) Appl. No.: 11/561,418

(22) Filed: Nov. 19, 2006

(65) Prior Publication Data
US 2007/0190686 A1    Aug. 16, 2007

(30) Foreign Application Priority Data
Feb. 13, 2006 (TW) .............................. 95104698 A (51) Int. Cl.
*H01L 21/50* (2006.01)
*H01L 21/48* (2006.01)
*H01L 21/44* (2006.01)

(52) U.S. Cl. ................. 438/125; 438/126; 438/106; 438/127

(58) Field of Classification Search ............ 438/125, 438/126, 106, 127
See application file for complete search history.

(56) References Cited

U.S. PATENT DOCUMENTS

| 6,865,089 | B2 * | 3/2005 | Ho et al. | 361/761 |
| 7,037,750 | B2 * | 5/2006 | Tsai et al. | 438/106 |
| 7,242,092 | B2 * | 7/2007 | Hsu | 257/723 |
| 7,262,497 | B2 * | 8/2007 | Fang | 257/701 |

* cited by examiner

*Primary Examiner*—Luan C Thai
(74) *Attorney, Agent, or Firm*—Jianq Chyun IP Office (57) ABSTRACT

A method of fabricating a substrate with an embedded component therein including the following steps is provided. First, a core layer having a first dielectric layer, a first patterned circuit layer, and a second patterned circuit layer is provided. The first patterned circuit layer and the second patterned circuit layer are disposed on an upper surface and a lower surface of the first dielectric layer, respectively. Then, a through hole is formed in the core layer. Next, the core layer is arranged on a supporting board and an embedded component having at least one electrode is disposed in the through hole. Afterward, a process of filling glue is carried out, such that the embedded component is fixed in the through hole. Thereafter, the supporting board is removed. Finally, the electrode of the embedded component is electrically connected to the second patterned circuit layer.

15 Claims, 11 Drawing Sheets

METHOD OF FABRICATING SUBSTRATE WITH EMBEDDED COMPONENT THEREIN

CROSS-REFERENCE TO RELATED APPLICATION

This application claims the priority benefit of Taiwan application serial no. 95104698, filed on Feb. 13, 2006. All disclosure of the Taiwan application is incorporated herein by reference.

BACKGROUND OF THE INVENTION

1. Field of Invention

The present invention relates to a method of fabricating a substrate. More particularly, the present invention relates to a method of fabricating a substrate with an embedded component therein.

2. Description of Related Art

Generally speaking, a circuit substrate is mainly formed through alternately stacking a plurality of patterned circuit layers and dielectric layers, wherein the patterned circuit layers are defined and formed through a lithography and etching process on copper foils, and the dielectric layers are arranged between the patterned circuit layers for isolating two adjacent patterned circuit layers. Additionally, the adjacent patterned circuit layers are electrically connected through plated through holes (PTH) or conductive vias penetrating the dielectric layers. Finally, various electronic components (such as active or passive components) are arranged on the surface of the circuit substrate, and the purpose of electrical signal propagation is achieved through the circuit design of internal circuits.

However, in order to satisfy the requirements of light weight, thinness, shortness, smallness, and convenience in carrying on electronic products in the market, during the process of manufacturing current electronic products, an electronic component which was originally welded onto the surface of a circuit substrate now may be designed as an embedded component inside the circuit substrate, so as to increase the wiring area in the surface of the circuit substrate and achieve the thinness of electronic products.

FIGS. 1A-1E are schematic sectional views of a conventional fabricating flow of a substrate with an embedded component therein. Firstly, referring to FIG. 1A, a core layer 110 including a first dielectric layer 112, a first patterned circuit layer 114, and a second patterned circuit layer 116 is provided. The first patterned circuit layer 114 and the second patterned circuit layer 116 are disposed on an upper surface 112a and a lower surface 112b of the first dielectric layer 112, respectively.

Figure 1A:
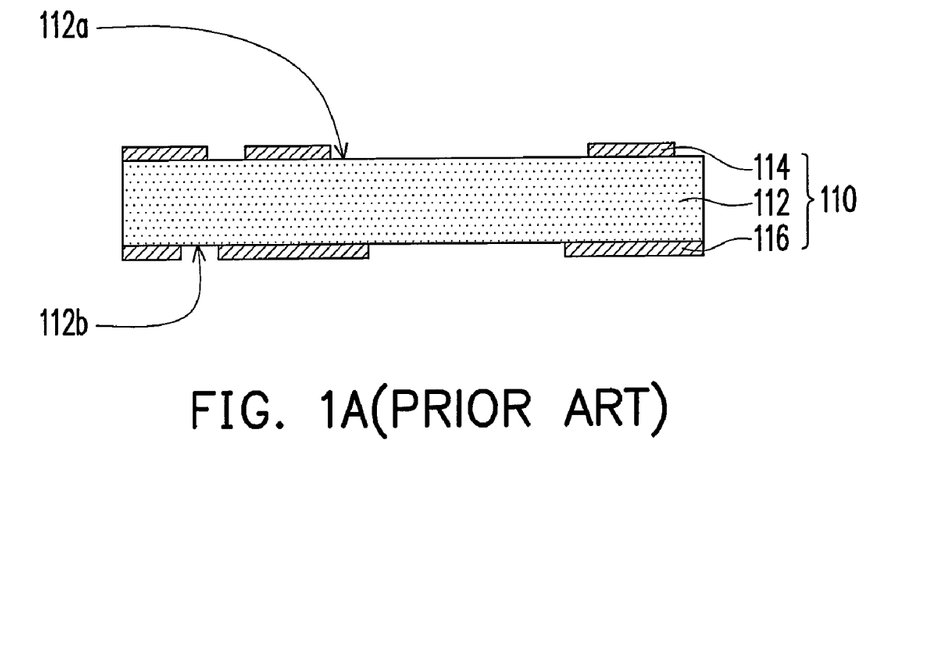
FIGS. 1A-1E are schematic sectional views of a conventional fabricating flow of a substrate with an embedded component therein.
Figure 1B:
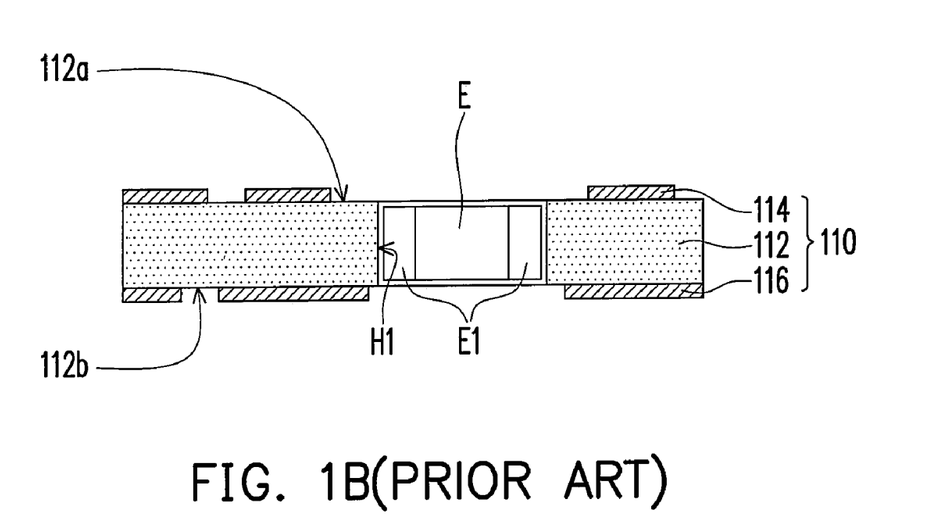
Figure 1C:
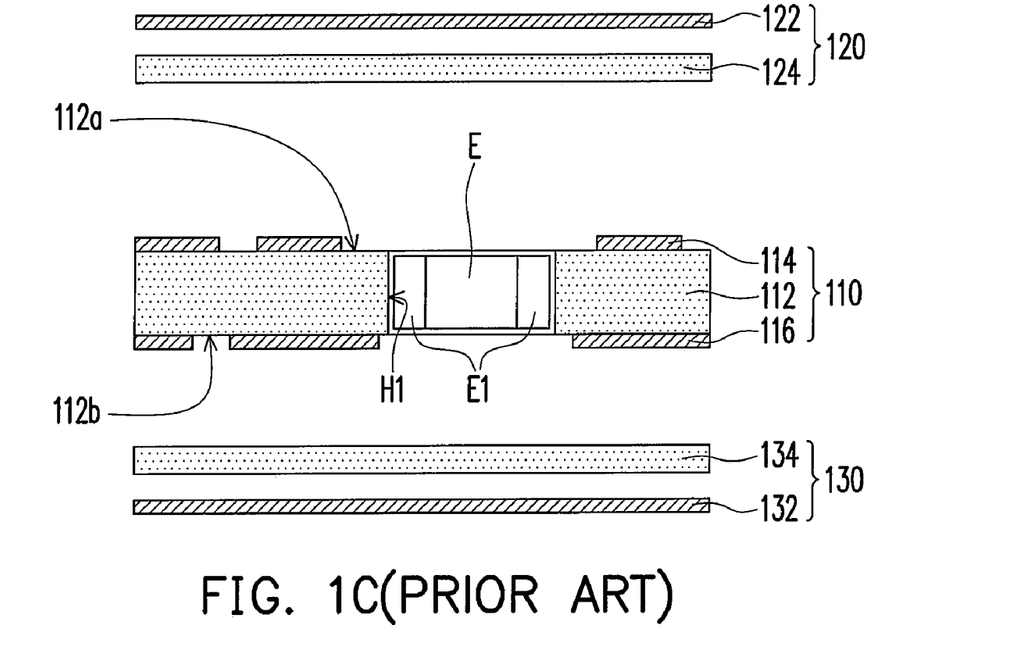

Next, referring to FIG. 1B, a through hole Hi is formed in the core layer 110 and an embedded component E is disposed in the through hole H1, wherein the embedded component E has two electrodes E1. Subsequently, Referring to FIG. 1C, a first laminated layer 120 and a second laminated layer 130 are arranged on the first patterned circuit layer 114 and the second patterned circuit layer 116, respectively, wherein the first laminated layer 120 includes a first metal layer 122 and a second dielectric layer 124, the second laminated layer 130 includes a second metal layer 132 and a third dielectric layer 134, and the second dielectric layer 124 and the third dielectric layer 134 face the first patterned circuit layer 114 and the second patterned circuit layer 116, respectively.

Figure 1D:
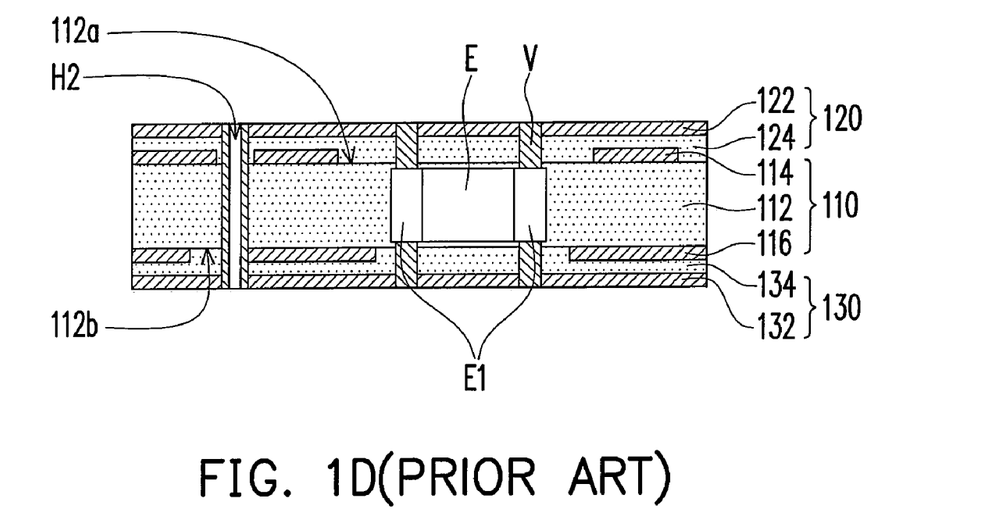

Furthermore, referring to FIG. 1D, the first laminated layer 120, the core layer 110, and the second laminated layer 130 are pressed together, and at least one plated through hole (PTH) H2 and a plurality of conductive vias V are formed. The plated through hole (PTH) H2 penetrates the first laminated layer 120, the core layer 110, and the second laminated layer 130, such that the first metal layer 122 and the second metal layer 132 are electrically connected through the plated through hole (PTH) H2. Additionally, the two electrodes E1 of the embedded component E are electrically connected to the first metal layer 122 and the second metal layer 132 respectively through the conductive vias V.

Figure 1E:
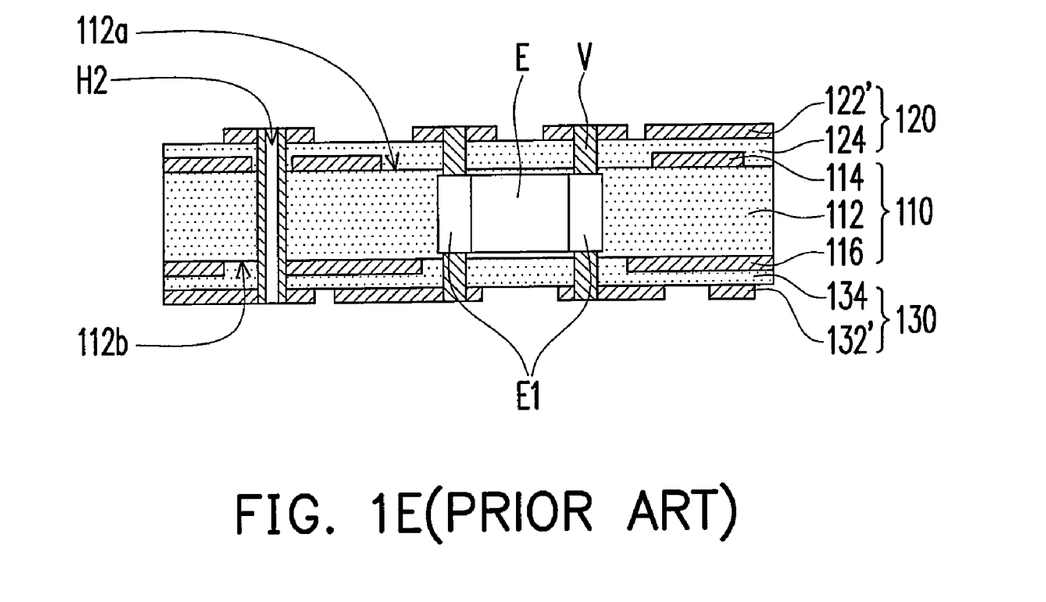

Finally, Referring to FIGS. 1D and 1E, the first metal layer 122 and the second metal layer 132 are patterned to form a first surface circuit 122' and a second surface circuit 132', which are electrically conducted by the plated through hole (PTH) H2. Furthermore, the two electrodes E1 of the embedded component E are electrically connected to the first surface circuit 122' and the second surface circuit 132' respectively through the conductive vias V. In this manner, the fabricating flow of the substrate with an embedded component therein is completed.

However, regarding the conventional method of fabricating the substrate with an embedded component therein, the embedded component E must be electrically connected to the first surface circuit 122' and the second surface circuit 132' through the conductive vias V, with a result that the wiring area of the first patterned circuit layer 114 and the second patterned circuit layer 116 is reduced and further the wiring density of the first patterned circuit layer 114 and the second patterned circuit layer 116 is also reduced. Additionally, the embedded component E must be electrically connected to the first surface circuit 122' and the second surface circuit 132' through the conductive vias V, which, however, increases the thickness of the whole circuit substrate and thus the requirements of light weight, thinness, shortness, and smallness on product design cannot be satisfied. Therefore, it is really necessary to improve the conventional method of fabricating the substrate with an embedded component therein.

SUMMARY OF THE INVENTION

Accordingly, the present invention is directed to providing a method of fabricating a substrate with an embedded component therein, so as to increase the wiring density of a first patterned circuit layer, a second patterned circuit layer, a first surface circuit, and a second surface circuit and significantly reduce the thickness of the whole substrate.

In order to achieve the aforementioned and other object, the method of fabricating a substrate with an embedded component therein provided by the present invention comprises the following steps. Firstly, a core layer comprising a first dielectric layer, a first patterned circuit layer, and a second patterned circuit layer is provided, wherein the first patterned circuit layer and the second patterned circuit layer are disposed on an upper surface and a lower surface of the first dielectric layer, respectively. Then, a through hole is formed in the core layer. Next, the core layer is arranged on a supporting board and an embedded component having at least one electrode is disposed in the through hole. Afterward, a process of filling glue is carried out, such that the embedded component is fixed in the through hole. Thereafter, the supporting board is removed. Finally, the electrode of the embedded component is electrically connected to the second patterned circuit layer.

In an embodiment of the present invention, the step of providing a core layer comprises patterning a first metal layer and a second metal layer on the upper surface and the lower surface of the first dielectric layer through a lithography and etching process, respectively, so as to form the first patterned circuit layer and the second patterned circuit layer on the upper surface and the lower surface of the dielectric layer.

In an embodiment of the present invention, the step of providing a core layer comprises patterning a first metal layer and a second metal layer on the upper surface and the lower surface of the first dielectric layer through a lithography and etching process, respectively, so as to form the first patterned circuit layer and the second patterned circuit layer on the upper surface and the lower surface of the dielectric layer. Furthermore, the material of the first metal layer and the second metal layer comprises copper.

In an embodiment of the present invention, the method of forming a through hole comprises mechanical drilling or laser drilling.

In an embodiment of the present invention, the supporting board is a glass plate or a PET film.

In an embodiment of the present invention, the embedded component comprises an active component and a passive component.

In an embodiment of the present invention, the process of filling glue is, for example, filling an adhesive into a gap between the embedded component and the through hole.

In an embodiment of the present invention, the step of electrically connecting the electrode of the embedded component to the second patterned circuit layer comprises the following steps. Firstly, a mask is arranged on the second patterned circuit layer, wherein the mask exposes the electrode and a part of the second patterned circuit layer. Then, a metal layer is formed on the lower surface of the first dielectric layer, wherein a part of the metal layer is electrically connected to the electrode and the second patterned circuit layer. Thereafter, the mask is removed.

In an embodiment of the present invention, the step of electrically connecting the electrode of the embedded component to the second patterned circuit layer comprises the following steps. Firstly, a mask is arranged on the second patterned circuit layer, wherein the mask exposes the electrode and a part of the second patterned circuit layer. Then, a metal layer is formed on the lower surface of the first dielectric layer, wherein a part of the metal layer is electrically connected to the electrode and the second patterned circuit layer. Thereafter, the mask is removed. Furthermore, the method of forming the metal layer comprises electro plating, electroless plating, physical vapor deposition, or chemical vapor deposition.

In an embodiment of the present invention, the step of electrically connecting the electrode of the embedded component to the second patterned circuit layer comprises the following steps. Firstly, a mask is arranged on the second patterned circuit layer, wherein the mask exposes the electrode and a part of the second patterned circuit layer. Then, a metal layer is formed on the lower surface of the first dielectric layer, wherein a part of the metal layer is electrically connected to the electrode and the second patterned circuit layer. Thereafter, the mask is removed. Furthermore, the method of forming the metal layer is coating a conductive adhesive on the lower surface of the first dielectric layer.

In an embodiment of the present invention, the electrode of the embedded component is electrically connected to the first patterned circuit layer while being electrically connected to the second patterned circuit layer.

In an embodiment of the present invention, after the step of electrically connecting the electrode of the embedded component to the second patterned circuit layer, the method further comprises the following steps. Firstly, a first laminated layer and a second laminated layer are arranged on the first patterned circuit layer and the second patterned circuit layer, respectively, wherein the first laminated layer comprises a third metal layer and a second dielectric layer, the second laminated layer comprises a fourth metal layer and a third dielectric layer, and the second dielectric layer and the third dielectric layer face the first patterned circuit layer and the second patterned circuit layer, respectively. Then, the first laminated layer, the core layer, and the second laminated layer are pressed together. Next, at least one plated through hole (PTH) is formed in the first laminated layer, the core layer, and the second laminated layer. Furthermore, the third metal layer and the fourth metal layer are patterned to form a first surface circuit and a second surface circuit, and the first surface circuit and the second surface circuit are conducted by the plated through hole (PTH).

In an embodiment of the present invention, after the step of electrically connecting the electrode of the embedded component to the second patterned circuit layer, the method further comprises the following steps. Firstly, a first laminated layer and a second laminated layer are arranged on the first patterned circuit layer and the second patterned circuit layer, respectively, wherein the first laminated layer comprises a third metal layer and a second dielectric layer, the second laminated layer comprises a fourth metal layer and a third dielectric layer, and the second dielectric layer and the third dielectric layer face the first patterned circuit layer and the second patterned circuit layer, respectively. Then, the first laminated layer, the core layer, and the second laminated layer are pressed together. Next, at least one plated through hole (PTH) is formed in the first laminated layer, the core layer, and the second laminated layer. Furthermore, the third metal layer and the fourth metal layer are patterned to form a first surface circuit and a second surface circuit, and the first surface circuit and the second surface circuit are conducted by the plated through hole (PTH). Furthermore, after the first surface circuit and the second surface circuit are formed, the method further comprises the following steps. Firstly, a first solder mask layer and a second solder mask layer are formed on the second dielectric layer and the third dielectric layer, respectively, wherein the first solder mask layer exposes at least a part of the first surface circuit, and the second solder mask layer exposes at least a part of the second surface circuit. Then, a first anti-oxidation layer is formed on at least a part of the first surface circuit exposed by the first solder mask layer, and a second anti-oxidation layer is formed on at least a part of the second surface circuit exposed by the second solder mask layer.

In an embodiment of the present invention, after the step of electrically connecting the electrode of the embedded component to the second patterned circuit layer, the method further comprises the following steps. Firstly, a first laminated layer and a second laminated layer are arranged on the first patterned circuit layer and the second patterned circuit layer, respectively, wherein the first laminated layer comprises a third metal layer and a second dielectric layer, the second laminated layer comprises a fourth metal layer and a third dielectric layer, and the second dielectric layer and the third dielectric layer face the first patterned circuit layer and the second patterned circuit layer, respectively. Then, the first laminated layer, the core layer, and the second laminated layer are pressed together. Next, at least one plated through hole (PTH) is formed in the first laminated layer, the core layer, and the second laminated layer. Furthermore, the third metal layer and the fourth metal layer are patterned to form a first surface circuit and a second surface circuit, and the first surface circuit and the second surface circuit are conducted by the plated through hole (PTH). Furthermore, after the first surface circuit and the second surface circuit are formed, the method further comprises the following steps. Firstly, a first solder mask layer and a second solder mask layer are formed on the second dielectric layer and the third dielectric layer, wherein the first solder mask layer exposes at least a part of the first surface circuit, and the second solder mask layer exposes at least a part of the second surface circuit. Then, a first anti-oxidation layer is formed on at least a part of the first surface circuit exposed by the first solder mask layer, and a second anti-oxidation layer is formed on at least a part of the second surface circuit exposed by the second solder mask layer. Additionally, the method of forming the first anti-oxidation layer and the second anti-oxidation layer comprises plating a nickel layer or a gold layer on at least a part of the first surface circuit exposed by the first solder mask layer and at least a part of the second surface circuit exposed by the second solder mask layer, respectively.

In an embodiment of the present invention, after the first surface circuit and the second surface circuit are formed, the method further comprises the following steps. Firstly, a first patterned anti-oxidation layer and a second patterned anti-oxidation layer are formed on the first surface circuit and the second surface circuit, respectively. Then, a first solder mask layer and a second solder mask layer are formed on the second dielectric layer and the third dielectric layer, wherein the first solder mask layer covers the first surface circuit and exposes the first anti-oxidation layer, and the second solder mask layer covers the second surface circuit and exposes the second anti-oxidation layer.

Based upon the above, regarding the method of fabricating the substrate with an embedded component therein provided by the present invention, the electrode of the embedded component is directly electrically connected to the first patterned circuit layer and the second patterned circuit layer in the inner layer, so as to enhance the wiring density of the first patterned circuit layer, the second patterned circuit layer, the first surface circuit, and the second surface circuit, and to improve the reliability of the electrical connection between the embedded component and the first patterned circuit layer or the second patterned circuit layer.

In addition, the embedded component is directly electrically connected to the patterned circuit layers in the inner layer without the conventional plated through hole (PTH), thereby efficiently reducing the thickness of the whole substrate such that the electronic products employing the substrate may satisfy the requirements of light weight, thinness, shortness, and smallness on product design.

In order to make aforementioned and other objects, features and advantages of the present invention comprehensible, a preferred embodiment accompanied with figures are described in detail below.

It is to be understood that both the foregoing general description and the following detailed description are exemplary, and are intended to provide further explanation of the invention as claimed.

DESCRIPTION OF EMBODIMENTS

FIGS. 2A-2J are schematic sectional views of a fabricating flow of a substrate with an embedded component therein according to an embodiment of the present invention. Firstly, referring to FIG. 2A, a core layer 210 including a first dielectric layer 212, a first patterned circuit layer 214, and a second patterned circuit layer 216 is provided. The first patterned circuit layer 214 and the second patterned circuit layer 216 are disposed on an upper surface 212a and a lower surface 212b of the first dielectric layer 212, respectively. In this embodiment, the step of providing the core layer 210 includes patterning a first metal layer (not shown, and the material thereof is copper) and a second metal layer (not shown, and the material thereof is copper) on the upper surface 212a and the lower surface 212b of the first dielectric layer 212 through a lithography and etching process, respectively, so as to form the first patterned circuit layer 214 and the second patterned circuit layer 216 on the upper surface 212a and the lower surface 212b of the first dielectric layer 212, respectively.

Figure 2A:
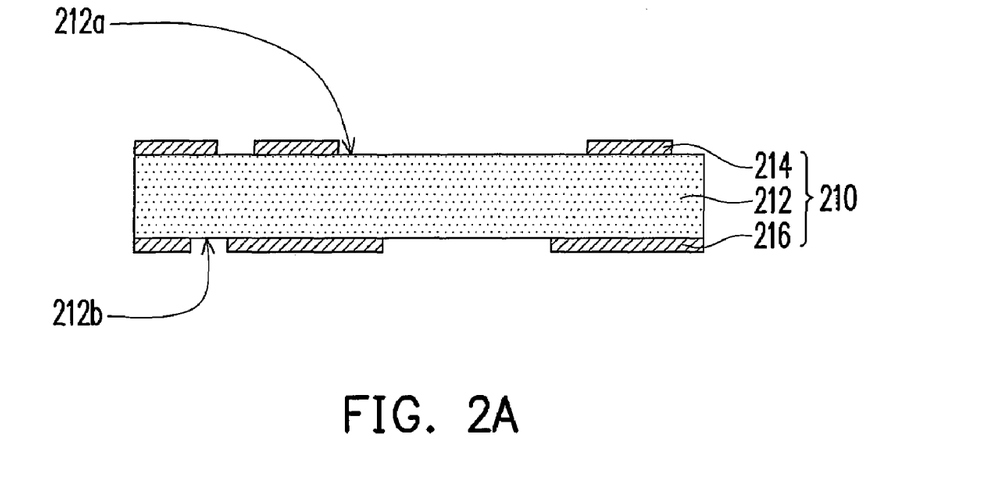
FIGS. 2A-2J are schematic sectional views of a fabricating flow of a substrate with an embedded component therein according to an embodiment of the present invention.
Figure 2B:
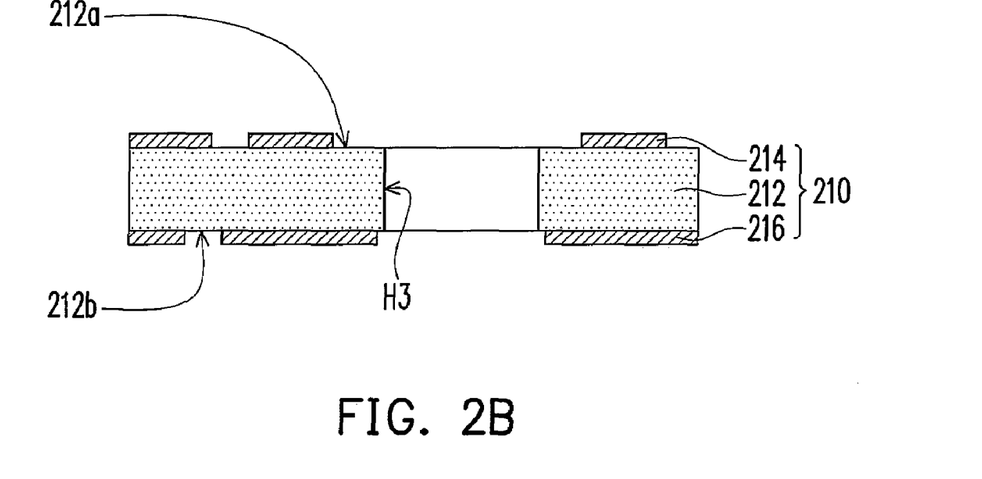
Figure 2C:
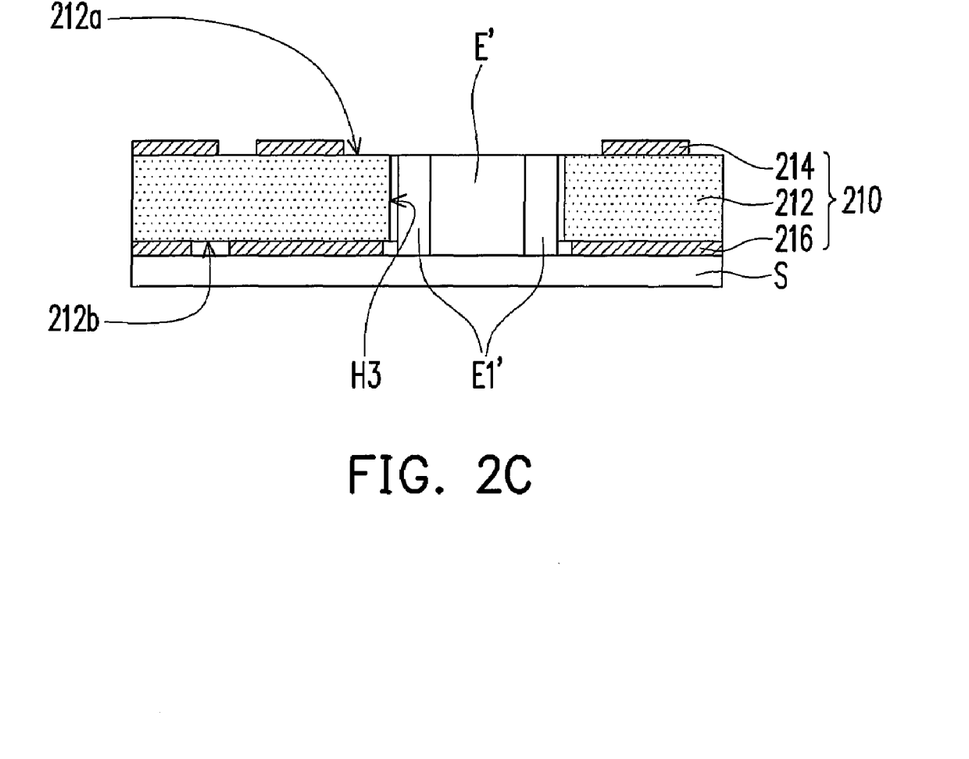

Then, referring to FIG. 2B, a through hole H3 is formed in the core layer 210 and the through hole H3 is formed by means of mechanical drilling, laser drilling, or the like. Next, referring to FIG. 2C, the core layer 210 is arranged on a supporting board S, and an embedded component E' is disposed in the through hole H3, wherein the embedded component E' has at least an electrode E1' (two shown in FIG. 2C). In this embodiment, the supporting board S is a glass plate, a PET film, or a board made of other materials. Furthermore, the embedded component E' includes an active component (such as a thin film transistor) and a passive element (such as a resistor, a capacitor, or an inductor). It should be noted that since the embedded component E' and the second patterned circuit layer 216 are supported by the supporting board S, the embedded component E' and the second patterned circuit layer 216 are approximately located on the same plane of the supporting board S.

Figure 2D:
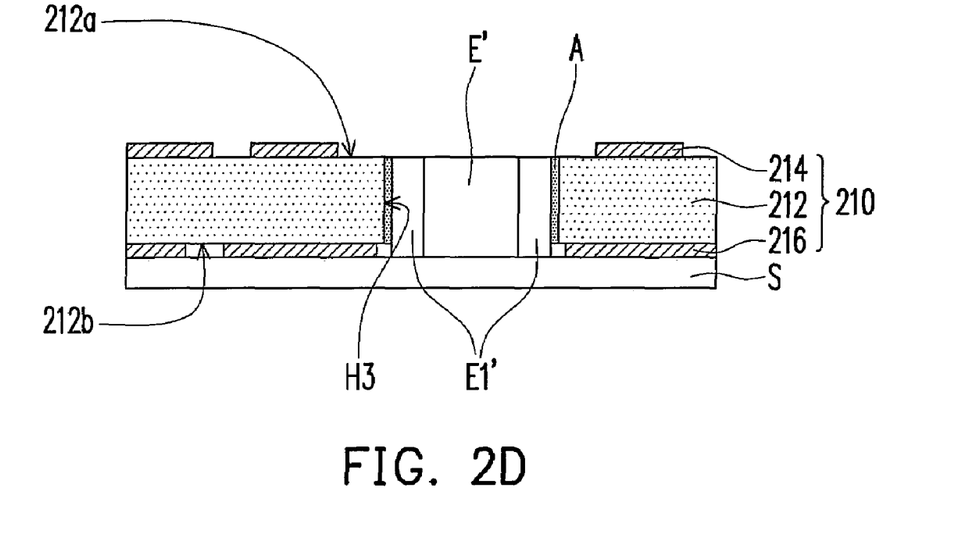

Furthermore, referring to FIG. 2D, a process of filling glue is carried out to fix the embedded component E' in the through hole H3. In this embodiment, the process of filling glue is filling an adhesive A into the gap between the embedded component E' and the through hole H3, and then curing the adhesive A, such that the embedded component E' is fixed in the through hole H3 in the core layer 210. Furthermore, the adhesive A is a thermal setting resin or an UV light setting resin, which are cured by means of heating or ultraviolet irradiation, respectively. Thereafter, referring to FIG. 2E, the supporting board S is removed.

Figure 2E:
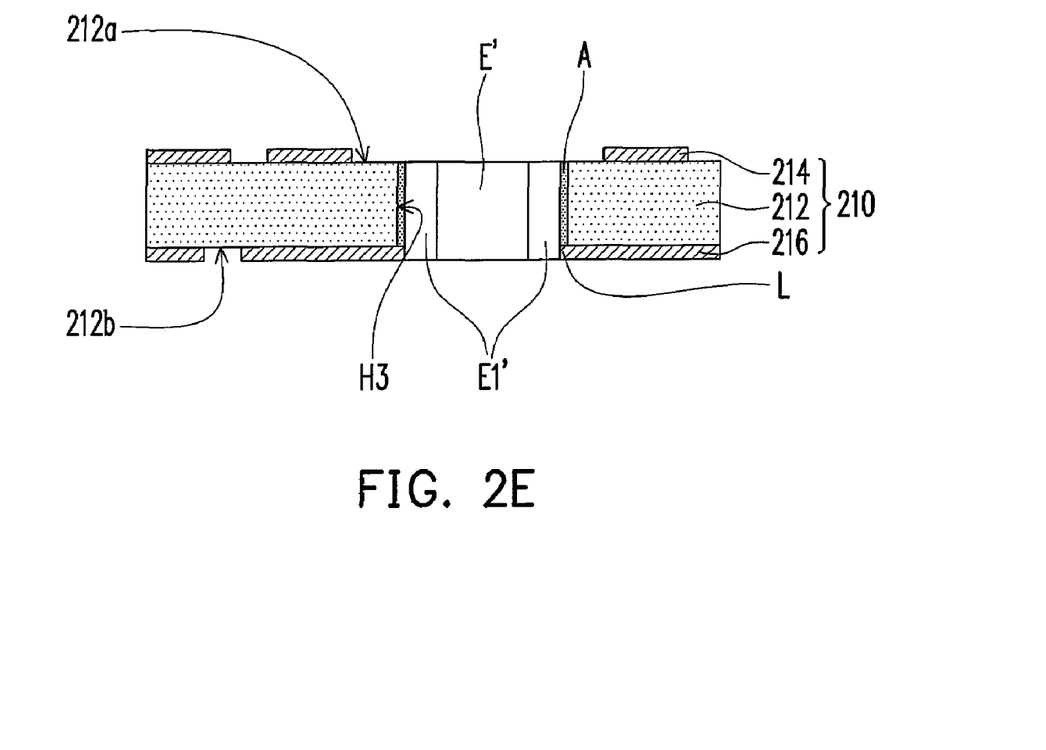
Figure 2F:
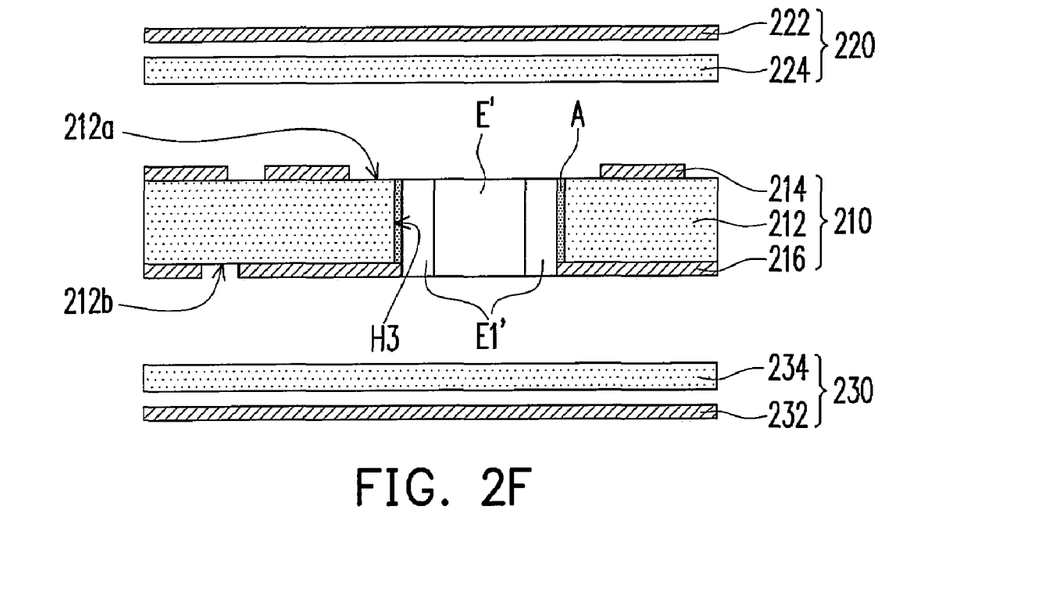

Then, referring to FIG. 2E, the electrodes E1' of the embedded component E' are electrically connected to the second patterned circuit layer 216. As such, the basic process of fabricating the substrate with an embedded component therein is completed.

Figure 3A:
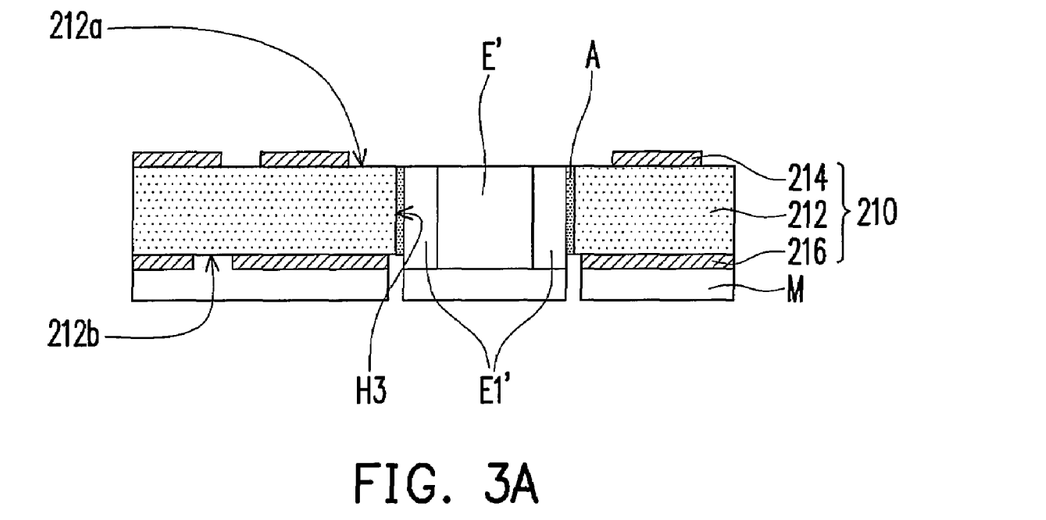
FIGS. 3A-3C are schematic sectional views of the flow of electrically connecting the electrodes of the embedded component to the second patterned circuit layer.
Figure 3B:
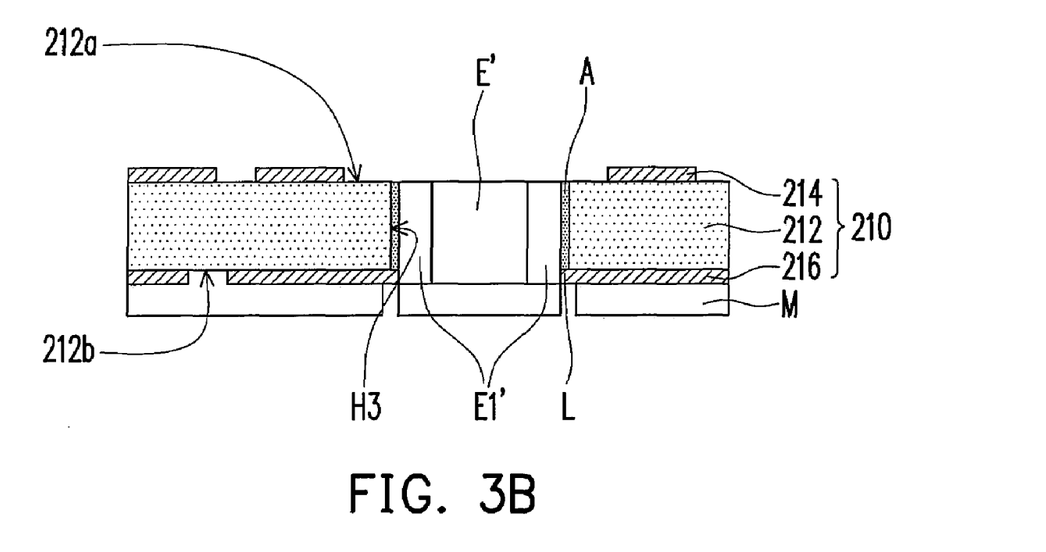
Figure 3C:
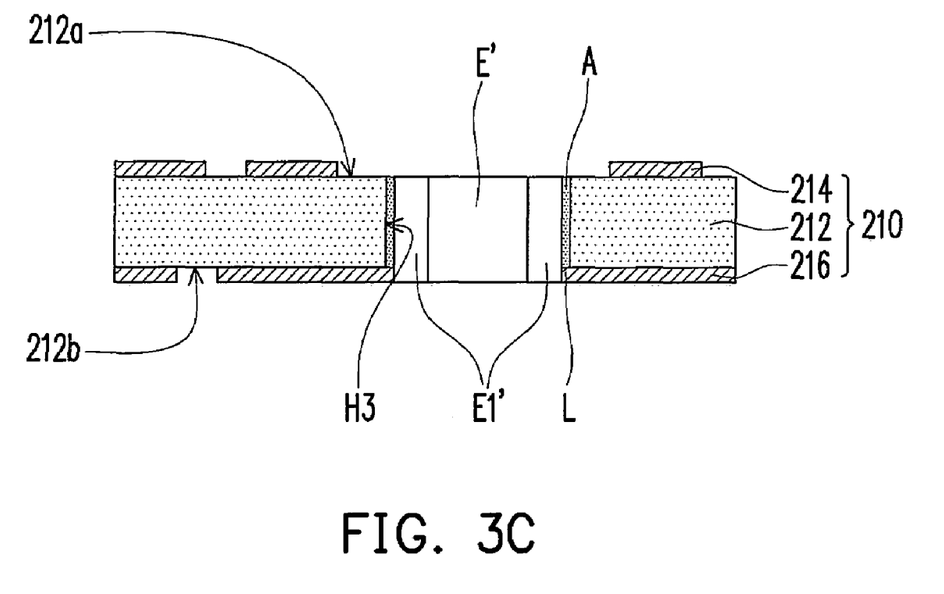

One method of electrically connecting the electrodes E1' of the embedded component E' to the second patterned circuit layer 216 will be described with reference to the drawings. However, users also may electrically connect the electrodes E1' of the embedded component E' to the second patterned circuit layer 216 by other means, and at this point, the present invention makes no limitations. FIGS. 3A-3C are schematic sectional views of the flow of electrically connecting the electrodes of the embedded component to the second patterned circuit layer. Specifically, firstly, referring to FIG. 3A, a mask M is arranged on the second patterned circuit layer 216, and the mask M exposes the electrodes E1' and a part of the second patterned circuit layer 216. Then, referring to FIG. 3B, a metal layer L is formed on the lower surface 212b of the first dielectric layer 212, wherein a part of the metal layer L is electrically connected to the electrodes E1' and the second patterned circuit layer 216. The method of forming the metal layer L includes electro plating, electroless plating, physical vapor deposition, chemical vapor deposition, and coating a conductive adhesive on the upper surface 212b of the first dielectric layer 212. Furthermore, referring to FIGS. 3B and 3C, the mask M is removed. As such, the electrodes E1' of the embedded component E' are electrically connected to the second patterned circuit layer 216 through the metal layer L. It should be indicated here that the electrodes E1' of the embedded component E' are also electrically connected to the first patterned circuit layer 214 while being electrically connected to the second patterned circuit layer 216. However, such circumstance is not shown.

After the electrodes E1' of the embedded component E' are electrically connected to the second patterned circuit layer 216, as shown in FIG. 2E, surface circuits, mask layers, and anti-oxidation layers are further formed on the surfaces of both sides of the substrate by the following two methods, such that the substrate becomes a substrate with a double-layer circuit therein.

FIGS. 2F-2J are sectional views of the flow of reserving electro plating lines on the substrate in advance to form the surface circuits, the mask layers, and the anti-oxidation layers on the surface of the substrate in sequence. Firstly, referring to FIG. 2F, a first laminated layer 220 and a second laminated layer 230 are arranged on the first patterned circuit layer 214 and the second patterned circuit layer 216, respectively. The first laminated layer 220 includes a third metal layer 222 and a second dielectric layer 224, the second laminated layer 230 includes a fourth metal layer 232 and a third dielectric layer 234, and the second dielectric layer 224 and the third dielectric layer 234 face the first patterned circuit layer 214 and the second patterned circuit layer 216, respectively. In other words, the second dielectric layer 224 is disposed between the third metal layer 222 and the first patterned circuit layer 214, and the third dielectric layer 234 is disposed between the fourth metal layer 232 and the second patterned circuit layer 216.

Figure 2G:
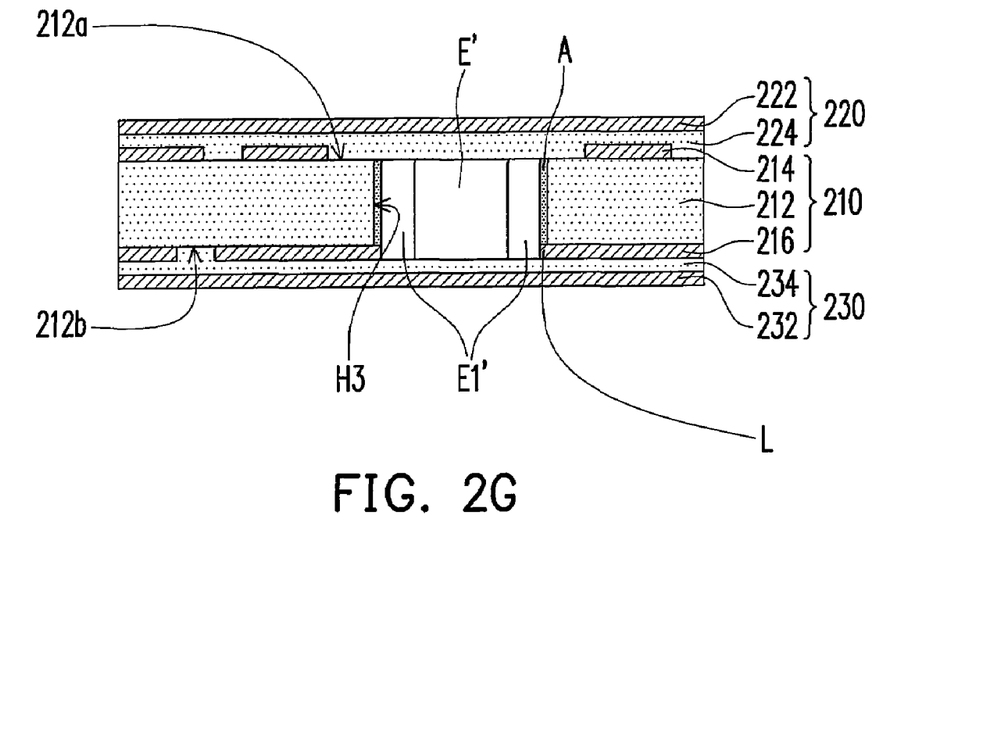

Referring to FIG. 2G, the first laminated layer 220, the core layer 210, and the second laminated layer 230 are pressed together, such that the first patterned circuit layer 214 and the second patterned circuit layer 216 are embedded in the second dielectric layer 224 and the third dielectric layer 234, respectively, and the third metal layer 222 and the fourth metal layer 232 are arranged on the second dielectric layer 224 and the third dielectric layer 234, respectively.

Figure 2H:
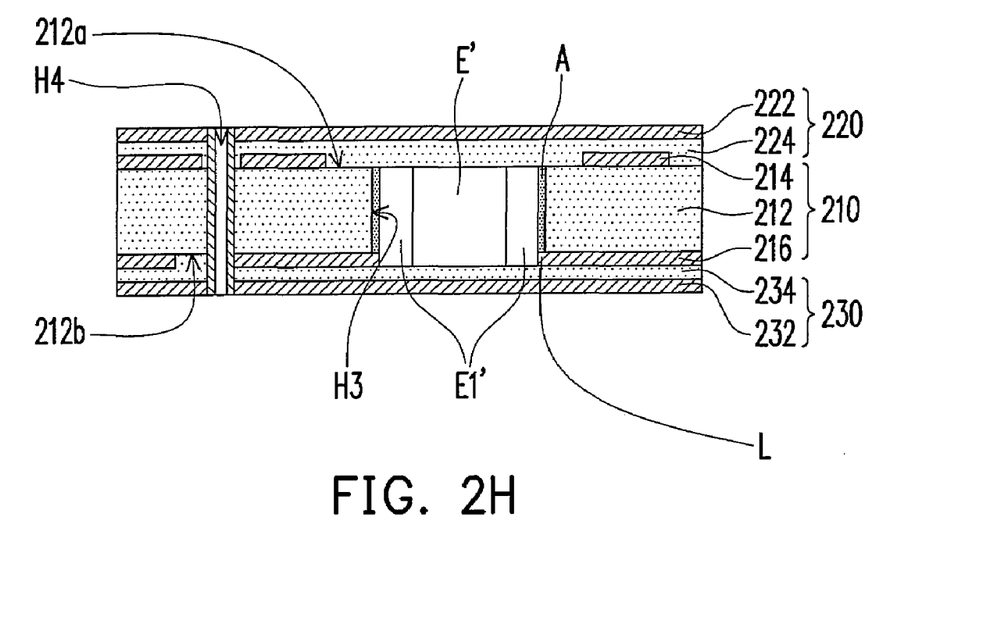

Furthermore, referring to FIG. 2H, at least one plated through hole (PTH) H4 is formed in the first laminated layer 220, the core layer 210, and the second laminated layer 230. In other words, the plated through hole (PTH) H4 penetrates the first laminated layer 220, the core layer 210, and the second laminated layer 230. The method of forming the plated through hole (PTH) H4 is, for example, forming a through hole by means of mechanical drilling or laser drilling and then plating copper on the periphery of the side wall or the interior portion of the side wall, so as to form the plated through hole (PTH) H4.

Figure 2I:
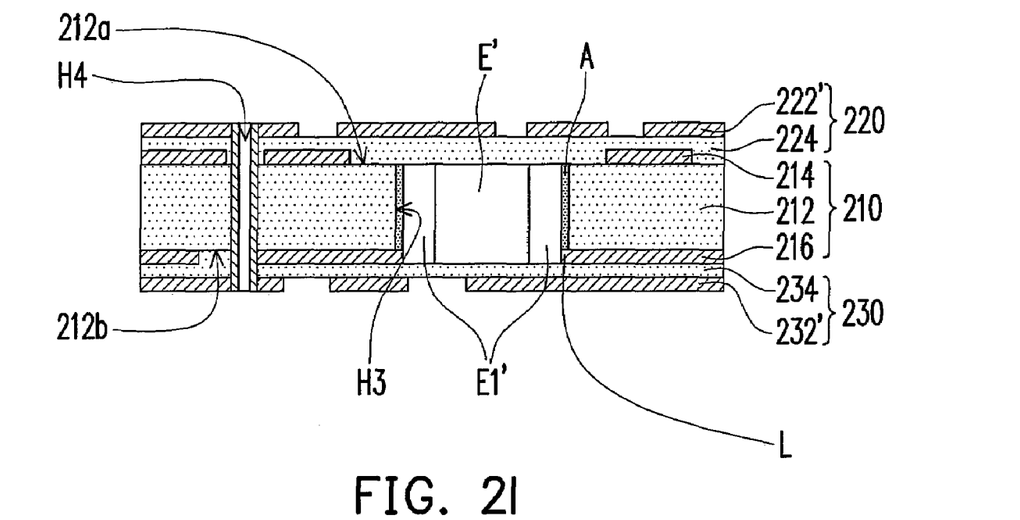

Additionally, referring to FIGS. 2H and 2I, the third metal layer 222 and the fourth metal layer 232 are patterned through a lithography and etching process, so as to form a first surface circuit 222' and a second surface circuit 232', respectively, and the first surface circuit 222' and the second surface circuit 232' are electrically conducted by the plated through hole (PTH) H4.

Figure 2J:
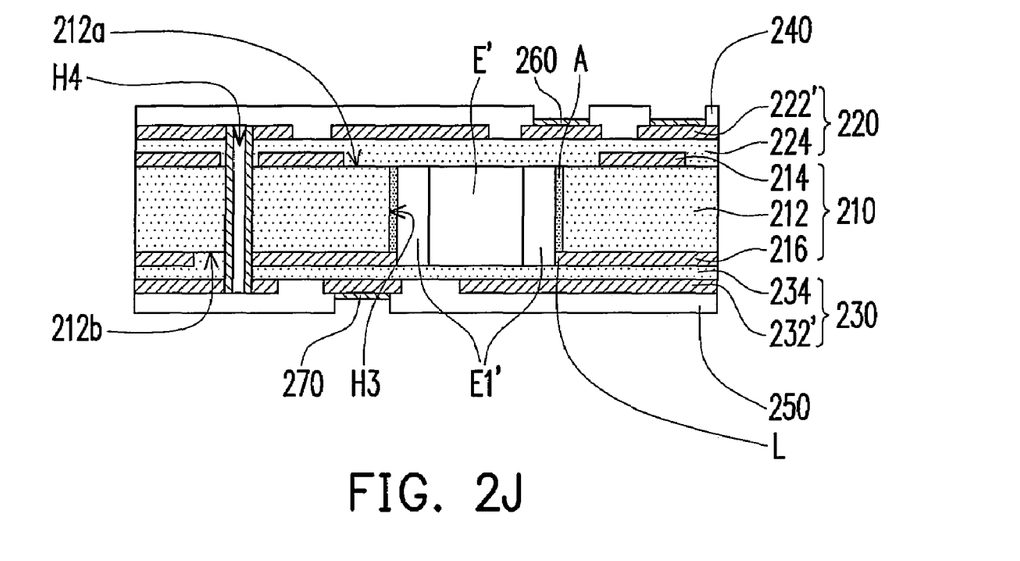

Thereafter, referring to FIG. 2J, a first solder mask layer 240 and a second solder mask layer 250 are formed on the second dielectric layer 224 and the third dielectric layer 234, respectively, wherein the first solder mask layer 240 exposes at least a part of the first surface circuit 222' and the second solder mask layer exposes at least a part of the second surface circuit 232'. It should be indicated here that the first solder mask layer 240 and the second solder mask layer 250 are used to protect the first surface circuit 222' and the second surface circuit 232', respectively, and the part of the first surface circuit 222' exposed by the first solder mask layer 240 and the part of the second surface circuit 232' exposed by the second solder mask layer 250 are, for example, electrical pads for acting as contacts to electrically connect to an external device or component.

Then, a first anti-oxidation layer 260 is formed on at least a part of the first surface circuit 222' exposed by the first solder mask layer 240, and a second anti-oxidation layer 270 is formed on at least of a part of the second surface circuit 232' exposed by the second solder mask layer 250. The material of the first anti-oxidation layer 260 and the second anti-oxidation layer 270 is a conductive material that is not easy to be oxidized, such as nickel or gold. The first anti-oxidation layer 260 and the second anti-oxidation layer 270 may be formed by means of electro plating, so as to prevent the exposed part of the first surface circuit 222' and the exposed part of the second surface circuit 232' from being oxidized when contacting air or aqueous vapor.

Figure 4:
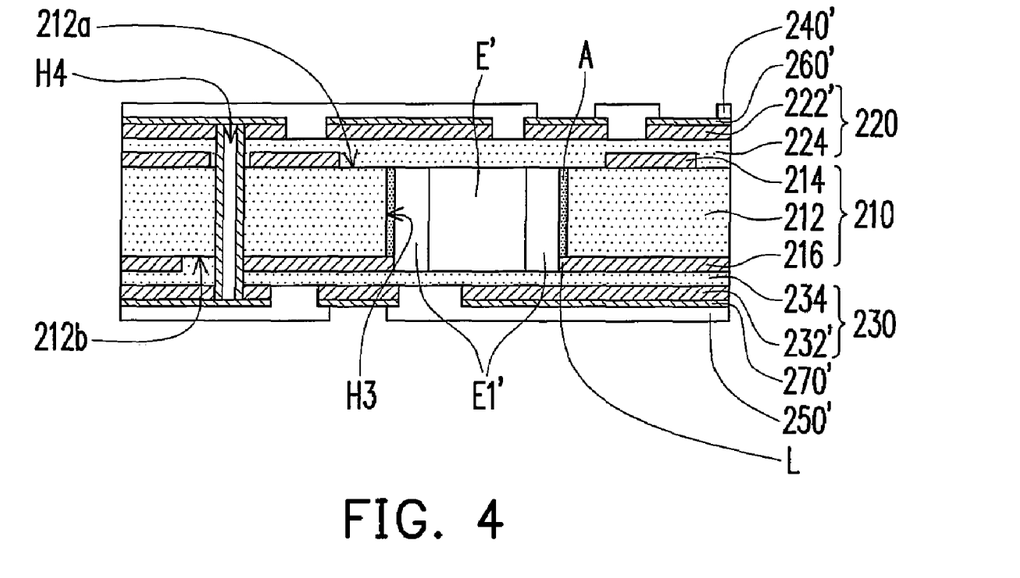
FIG. 4 is a schematic sectional view of the flow of forming the mask layers and the anti-oxidation layers according to another embodiment of the present invention.

In another embodiment of the present invention, the steps of forming the mask layers and the anti-oxidation layers shown in FIG. 2J may be changed in the sequence. Referring to FIGS. 2I and 4, FIG. 4 is a schematic sectional view of the flow of forming the mask layers and the anti-oxidation layers according to another embodiment of the present invention. After the first surface circuit 222' and the second surface circuit 232' are formed, as shown in FIG. 2I, the method may further include the following steps. For example, firstly, a first patterned anti-oxidation layer 260' and a second patterned anti-oxidation layer 270' are formed on the first surface circuit 222' and the second surface circuit 232' through a lithography and etching process, respectively.

Then, a first solder mask layer 240' and a second solder mask layer 250' are formed on the second dielectric layer 224 and the third dielectric layer 234, respectively, wherein the first solder mask layer 240' covers the first surface circuit 222' and exposes the first anti-oxidation layer 260', and the second solder mask layer 250' covers the second surface circuit 232' and exposes the second anti-oxidation layer 270'. In this embodiment, the function of the first solder mask layer 240' and the second solder mask layer 250' is the same as that of the first solder mask layer 240 and the second solder mask layer 250 (referring to FIG. 2J), the material, the formation method, and the function of the first anti-oxidation layer 260' and the second anti-oxidation layer 270' are the same as those of the first anti-oxidation layer 260 and the second anti-oxidation layer 270 (referring to FIG. 2J), which all will not be described here any more.

In view of the above, the method of fabricating the substrate with an embedded component therein at least has the following advantages.

1. Since during the process of fabricating the substrate with an embedded component therein provided by the present invention, the electrodes of the embedded component are electrically connected to the first patterned circuit layer or the second patterned circuit layer in the inner layer, the wiring density of the first patterned circuit layer, the second patterned circuit layer, the first surface circuit, and the second surface circuit is enhanced, and the reliability of the electrical connection between the embedded component and the first patterned circuit layer or the second patterned circuit layer is improved as well.

2. The embedded component is directly electrically connected to the first patterned circuit layer or the second patterned circuit layer in the inner layer without the conventional plated through hole (PTH), thereby efficiently reducing the thickness of the whole substrate, such that the electronic products employing the substrate may satisfy the requirements of light weight, thinness, shortness, and smallness on product design.

3. Since during the process of fabricating the substrate with an embedded component therein provided by the present invention, the electrodes of the embedded component are electrically connected to the first patterned circuit layer or the second patterned circuit layer in the inner layer, the cross-talk effect of electrical signals propagated between the electrodes of the embedded component and the first patterned circuit layer or the second patterned circuit layer is reduced, thereby enhancing the electrical performance.

4. Since during the process of fabricating the substrate with an embedded component therein provided by the present invention, the electrodes of the embedded component are not electrically connected to the first patterned circuit layer or the second patterned circuit layer in the inner layer through forming conductive vias, the fabricating cost of the substrate with an embedded component therein provided by the present invention is low.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a substrate with an embedded component therein, comprising:
   providing a core layer comprising a first dielectric layer, a first patterned circuit layer, and a second patterned circuit layer, wherein the first patterned circuit layer and the second patterned circuit layer are disposed on an upper surface and a lower surface of the first dielectric layer, respectively;
   forming a through hole in the core layer;
   arranging the core layer on a supporting board and disposing an embedded component in the through hole, wherein the embedded component comprises at least one electrode;
   performing a process of filling glue to fix the embedded component in the through hole;
   removing the supporting board; and
   electrically connecting the electrode of the embedded component to the second patterned circuit layer.

2. The method of fabricating a substrate with an embedded component therein as claimed in claim 1, wherein the step of providing the core layer comprises:
   patterning a first metal layer and a second metal layer on the upper surface and the lower surface of the first dielectric layer through a lithography and etching process, respectively, so as to form the first patterned circuit layer and the second patterned circuit layer on the upper surface and the lower surface of the first dielectric layer.

3. The method of fabricating a substrate with an embedded component therein as claimed in claim 2, wherein the material of the first metal layer and the second metal layer comprises copper.

4. The method of fabricating a substrate with an embedded component therein as claimed in claim 1, wherein the method of forming the through hole comprises mechanical drilling or laser drilling.

5. The method of fabricating a substrate with an embedded component therein as claimed in claim 1, wherein the supporting board is a glass plate or a PET film.

6. The method of fabricating a substrate with an embedded component therein as claimed in claim 1, wherein the embedded component comprises an active component or a passive component.

7. The method of fabricating a substrate with an embedded component therein as claimed in claim 1, wherein the process of filling glue is filling an adhesive into a gap between the embedded component and the through hole.

8. The method of fabricating a substrate with an embedded component therein as claimed in claim 1, wherein the step of electrically connecting the electrode of the embedded component to the second patterned circuit layer comprises:
   arranging a mask on the second patterned circuit layer, wherein the mask exposes the electrode and a part of the second patterned circuit layer;
   forming a metal layer on the lower surface of the first dielectric layer, wherein a part of the metal layer is electrically connected to the electrode and the second patterned circuit layer; and
   removing the mask.

9. The method of fabricating a substrate with an embedded component therein as claimed in claim 8, wherein the method of forming the metal layer comprises electro plating, electroless plating, physical vapor deposition, or chemical vapor deposition.

10. The method of fabricating a substrate with an embedded component therein as claimed in claim 8, wherein the method of forming the metal layer is coating a conductive adhesive on the lower surface of the first dielectric layer.

11. The method of fabricating a substrate with an embedded component therein as claimed in claim 1, wherein the electrode of the embedded component is electrically connected to the first patterned circuit layer while being electrically connected to the second patterned circuit layer.

12. The method of fabricating a substrate with an embedded component therein as claimed in claim 1, wherein after the step of electrically connecting the electrode of the embedded component to the second patterned circuit layer, the method further comprises:
   arranging a first laminated layer and a second laminated layer on the first patterned circuit layer and the second patterned circuit layer, respectively, wherein the first laminated layer comprises a third metal layer and a second dielectric layer, the second laminated layer comprises a fourth metal layer and a third dielectric layer, and the second dielectric layer and the third dielectric layer face the first patterned circuit layer and the second patterned circuit layer, respectively;
   pressing the first laminated layer, the core layer, and the second laminated layer together;
   forming at least one plated through hole (PTH) in the first laminated layer, the core layer, and the second laminated layer; and
   patterning the third metal layer and the fourth metal layer to form a first surface circuit and a second surface circuit, and conducting the first surface circuit and the second surface circuit by the plated through hole (PTH).

13. The method of fabricating a substrate with an embedded component therein as claimed in claim 12, wherein after the first surface circuit and the second surface circuit are formed, the method further comprises:
   forming a first solder mask layer and a second solder mask layer on the first laminated layer and the second laminated layer, respectively, wherein the first solder mask layer exposes at least a part of the first surface circuit and the second solder mask layer exposes at least a part of the second surface circuit; and
   forming a first anti-oxidation layer on the part of the first surface circuit exposed by the first solder mask layer and a second anti-oxidation layer on the part of the second surface circuit exposed by the second solder mask layer.

14. The method of fabricating a substrate with an embedded component therein as claimed in claim 13, wherein the method of forming the first anti-oxidation layer and the second anti-oxidation layer comprises plating a nickel/gold layer on the part of the first surface circuit exposed by the first solder mask layer and the part of the second surface circuit exposed by the second solder mask layer, respectively.

15. The method of fabricating a substrate with an embedded component therein as claimed in claim 12, wherein after the first surface circuit and the second surface circuit are formed, the method further comprises:
   forming a first patterned anti-oxidation layer and a second patterned anti-oxidation layer on the first surface circuit and the second surface circuit, respectively; and
   forming a first solder mask layer and a second solder mask layer on the first laminated layer and the second laminated layer, respectively, wherein the first solder mask layer covers the first anti-oxidation layer on the first surface circuit and exposes at least a part of the first anti-oxidation layer, and the second solder mask layer covers the second anti-oxidation layer on the second surface circuit and exposes at least a part of the second anti-oxidation layer.

* * * * *